US007912233B2

(12) United States Patent
Takagi et al.

(10) Patent No.: US 7,912,233 B2
(45) Date of Patent: Mar. 22, 2011

(54) SPEAKER SYSTEM FOR MUSICAL INSTRUMENTS

(75) Inventors: Masayuki Takagi, Hamamatsu (JP); Kosuke Takata, Hamamatsu (JP)

(73) Assignee: Roland Corporation, Hamamatsu, Shizuoka-ken (JP)

( * ) Notice: Subject to any disclaimer, the term of this patent is extended or adjusted under 35 U.S.C. 154(b) by 1219 days.

(21) Appl. No.: 11/523,303

(22) Filed: Sep. 19, 2006

(65) Prior Publication Data

US 2007/0076906 A1 Apr. 5, 2007

(30) Foreign Application Priority Data

Sep. 20, 2005 (JP) ................................ 2005-271432

(51) Int. Cl.
*G10H 1/00* (2006.01)
*H03F 99/00* (2009.01)
*H03G 3/00* (2006.01)

(52) U.S. Cl. ......................... 381/118; 381/121; 381/108

(58) Field of Classification Search .................. 381/118, 381/120, 121, 28, 107, 108, 94.9
See application file for complete search history.

(56) References Cited

U.S. PATENT DOCUMENTS 5,588,065 A * 12/1996 Tanaka et al. .................. 381/96
5,814,752 A * 9/1998 Rivera ............................ 84/711

FOREIGN PATENT DOCUMENTS

| | | |
|---|---|---|
| JP | 59-36687 | 3/1984 |
| JP | 63-16789 | 2/1988 |
| JP | 03-104500 | 5/1991 |
| JP | 04-040199 | 2/1992 |
| JP | 06-284492 | 10/1994 |
| JP | 2003-087892 | 3/2003 |

* cited by examiner

*Primary Examiner* — Curtis Kuntz
*Assistant Examiner* — Hai Phan
(74) *Attorney, Agent, or Firm* — Foley & Lardner LLP

(57) ABSTRACT

A speaker system for a musical instrument that detects the displacement of a voice coil of a speaker and provides feedback processing. The speaker system has a preamp that alters the frequency characteristics of the an electrical signal that has been input to an input terminal, and a power amplifier that amplifies the electrical signal. A speaker is driven by the power amplifier and a feedback unit detects the displacement of the speaker and provides a feedback signal to the power amplifier. The power amplifier amplifies the electrical signal in conformance with the output of the preamp and the feedback signal.

22 Claims, 5 Drawing Sheets

(a)

(b)

SPEAKER SYSTEM FOR MUSICAL INSTRUMENTS

CROSS-REFERENCE TO RELATED PATENT APPLICATIONS

The present invention relates to Japan Patent Application 2005-271432, filed Sep. 20, 2005 including the specification, drawings, claims and abstract, is incorporated herein by reference in its entirety and from which a priority filing date is claimed.

BACKGROUND OF THE INVENTION

1. Field of the Invention

Embodiments of the present invention relate generally to speaker systems and methods, and in specific embodiments, to speaker systems for musical instruments that detect displacement of the voice coil, and process such displacement information in feedback to alleviate non-linear distortion, in which the user has control over the amount of motion feedback applied.

2. Related Art

In speaker systems for audio use, motional feedback (hereinafter referred to as "MFB") is known in which the displacement of the voice coil of a speaker or the displacement of a sensor cap and the like is detected. The detected displacement is used as a difference value with the input signal as negative feedback, and the difference value is amplified by a power amplifier to drive a speaker.

It is known that the non-linear movement of the speaker is vastly improved by means of this MFB processing. In Japanese Laid-Open Patent Application Publication (Kokai) Number H 10-276492, which is incorporated herein by reference in its entirety, an MFB speaker system is disclosed in which the output of a filter to which the displacement that has been detected and the sound signal are supplied is averaged, and an abnormal sound is avoided, even in those cases where the center of the voice coil oscillation displacement has shifted.

However, in the MFB speaker systems of the past, although it is possible to improve the non-linear speaker movement, such systems have been impractical for musical instruments, because it is not possible to actively set the characteristics such as the timbre and the like of the musical tones that are produced.

In prior speakers for musical instruments that produce many low tones such as a bass guitar and the like, or musical instruments that have a wide tonal range like a piano, when the low tones are reproduced, the amplitude of the mechanical oscillation of the voice coil and the cone paper of the speaker is great. As a result, because non-linear distortion is produced and high amplitude sounds hit a peak, it has not been possible to satisfactorily carry out dynamic expression. Because of this, the performer may tend to feel that he or she must perform more forcefully in order to make the musical tones that have been produced by one's own performance better.

SUMMARY OF THE DISCLOSURE

Therefore, a speaker system for a musical instrument according to one embodiment of the present invention is furnished with an input terminal to which an electrical signal may be input. A preamp is connected to alter the frequency characteristics of the electrical signal that has been input to the input terminal. A power amplifier is connected to amplify the electrical signal and to drive a speaker. Feedback means detects the displacement of the speaker and feeds back the signal that has been detected to the power amplifier. The power amplifier amplifies the electrical signal in conformance with the output of the preamp and the feedback signal that has been fed back by the feedback means. Motional feedback in the speaker system of a musical instrument, can provide the advantageous result that the non-linear distortion that is output from the speaker is low such that it is possible to more faithfully reproduce and output the dynamic expression of the performance by the performer.

A speaker system for a musical instrument according to a further embodiment is furnished with feedback amount setting means that sets the amount of the feedback signal that is fed back by the feedback means as desired. The power amplifier amplifies the electrical signal in conformance with the output of the preamp and the feedback signal, the feedback amount of which has been set by the feedback amount setting means. Accordingly, the amount of feedback can be set as desired by the feedback amount setting means and it is possible to set the timbre that the performer intends.

A speaker system for a musical instrument according to a further embodiment is one in which the speaker is furnished with a cylindrical shaped voice coil that has a reflecting plate in the center. A light source that radiates light toward the reflecting plate, and a photoreceptor element receives the light that has been reflected by the reflecting plate. Accordingly, it is possible to accurately detect the displacement due to the oscillation of the voice coil using an optical format.

A speaker system for a musical instrument according to yet a further embodiment is furnished with level detection means that detects the output level of the preamp. The feedback amount setting means sets the amount of the feedback in conformance with the level that has been detected by the level detection means. For example, in those cases where the output level of the preamp is high, even if the amount of the feedback is made large, if there is no margin in the power amplifier performance, this will, on the contrary, be the cause of the generation of the electrical distortion of the preamp. Accordingly, in this case, the amount of feedback when the output level of the preamp is high, may be made small and the amount of feedback may be made large when the output level of the preamp is low. On the other hand, in those cases where there is a margin in the power amplifier performance, by making the amount of the feedback large when the output level of the preamp is high, it is possible to broaden the dynamic range and to expand the breadth of performance expression.

A speaker system for a musical instrument according to yet a further embodiment is furnished with a volume control operator that sets the volume of the audio that is output by the speaker as desired. The feedback amount setting means sets the amount of the feedback in conformance with the amount of operation that has been set by the volume control operator. For example, the settings can be made such that in those cases where the output level has been set high using the volume control, the amount of the feedback is small and in those cases where the output level has been set low using the volume control, the amount of the feedback is large.

A speaker system for a musical instrument according to yet a further embodiment is one in which the preamp is furnished with an equalizer operator that sets each of the levels of a plurality of frequency bands as desired. The feedback amount setting means sets the amount of the feedback in conformance with the amount of operation that has been set by the equalizer operator. For example, the settings can be made such that in those cases where it has been set so that the level of the low register is high using the equalizer operator, the amount of the feedback is small and in those cases where it has been set so that the level of the low register is low using the equalizer operator, the amount of the feedback is large.

A speaker system for a musical instrument according to yet a further embodiment is furnished with a low pass filter through which the low frequency component of the output of the preamp passes. The level detection means detects the output level of the low pass filter. Accordingly, by detecting the output level of the low pass filter, it is possible to set the amount of the feedback in conformance with the level of the low-pitched sounds for which the effect of the MFB processing is particularly great.

A speaker system for a musical instrument according to yet a further embodiment is furnished with sense adjusting means that adjusts the value of the output level of the preamp that has been detected by the level detection means as desired. The feedback amount setting means sets the amount of the feedback in conformance with the value to which the value of the level that has been detected by the level detection means, as adjusted by the sense adjusting means. Accordingly, it is possible to set the percentage of the amount of the feedback that is set in conformance with the value of the output level of the preamp (the sensitivity) as desired by means of the sense adjusting means and a feedback level can be obtained that conforms to the output level of the preamp that the performer intends.

DETAILED DESCRIPTION

Figure 1:
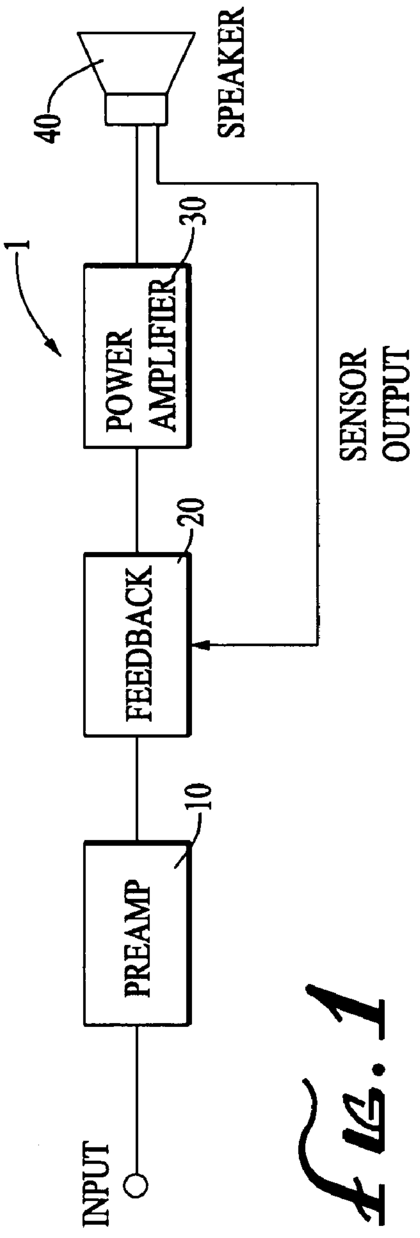
FIG. 1 is a block diagram that shows an electrical configuration of a speaker system for a musical instrument according to an embodiment of the present invention.

FIG. 1 is a block diagram of a speaker system 1 of an embodiment of the present invention. Components of the speaker system 1 are described with reference to functional blocks and not necessarily discrete hardware elements. The functions may be implemented using one or more of hardware, software, and firmware. In addition, more than one function, or different parts of functions, may be combined in a given hardware, software, or firmware implementation.

The speaker system 1 may be a speaker system for a musical instrument, and comprises: an input terminal 2, a preamplifier unit 10 (preamp unit), a feedback unit 20, a power amplifier unit 30, and a speaker section 40. However, the speaker system may be used in other non-musical applications as well. An electric signal may be applied to a input terminal 51, which then enters the preamp unit 10. The electric signal may be generated from a musical instrument, such as an electronic piano, electronic keyboard, electric guitar, electric bass, or the like. The signal source might also be a pre-recorded signal stored on a compact disc, tape, computer hard drive, flash memory, or other storage medium.

The preamp unit 10 adjusts frequency characteristics and level of the electric signal applied to it from the input terminal 51, and generates an output signal that is fed into the feedback unit 20. The output of the preamp unit 10 and the output of the sensor 45 (FIG. 3) that detects displacement of the voice coil 41 (FIG. 3) of the speaker 40, are input to the feedback unit 20. The feedback unit 20 generates an output signal that is fed into the power amplifier unit 30. The power amplifier unit 30 carries out power amplification of the output signal generated by the feedback unit 20. This amplified signal drives the speaker section 40.

Figure 2:
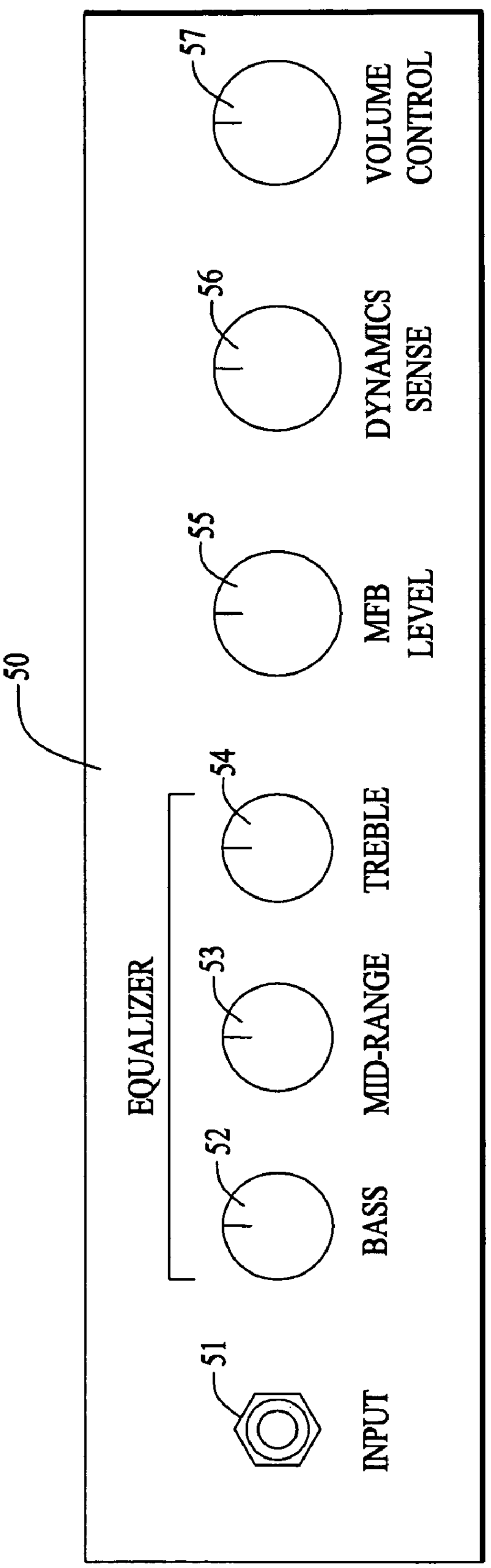
FIG. 2 is a schematic diagram of an operating panel for a speaker system according to an embodiment of the present invention.

FIG. 2 shows a schematic diagram of an operating panel 50 of the speaker system 1 of an embodiment of the present invention. The operating panel 50 comprises the input terminal 51, a bass adjustment knob 52, a mid-range adjustment knob 53, a treble adjustment knob 54, a motional feedback level adjustment knob (MFB knob) 55, a dynamics sense knob 56, and a volume control knob 57. The bass 52, mid-range 53, and treble 54 adjustment knobs adjust the frequency characteristics of the input electric signal. The MFB knob 55 adjusts the amount of feedback of the sensor 45 output. The dynamics sense knob 56 adjusts the output level of the preamp unit 10 in those cases in which the output of the preamp unit 10 is detected and the amount of feedback of the output of the sensor 45 is changed in accordance with that level. The volume control knob 57 adjusts the volume of the speaker system 1.

In an embodiment of the present invention, the input terminal 51 may be an input jack or socket that is configured to accept an output plug from a musical instrument. The plug can be freely connected to and disconnected from the input terminal 51. The bass adjustment knob 52, mid-range adjustment knob 53, and treble adjustment knob 54, respectively adjust parameters within the equalizer 12 (see FIG. 4) that control the bass, mid-range, and treble portions of the frequency spectrum of the input electric signal. All of the knobs 52, 53, 54, 55, 56, 57 are fastened to the shaft of a rotating-type variable resistor. Adjusting the resistance of each variable resistor by turning the knobs affects the signal each is designated to control.

Figure 3:
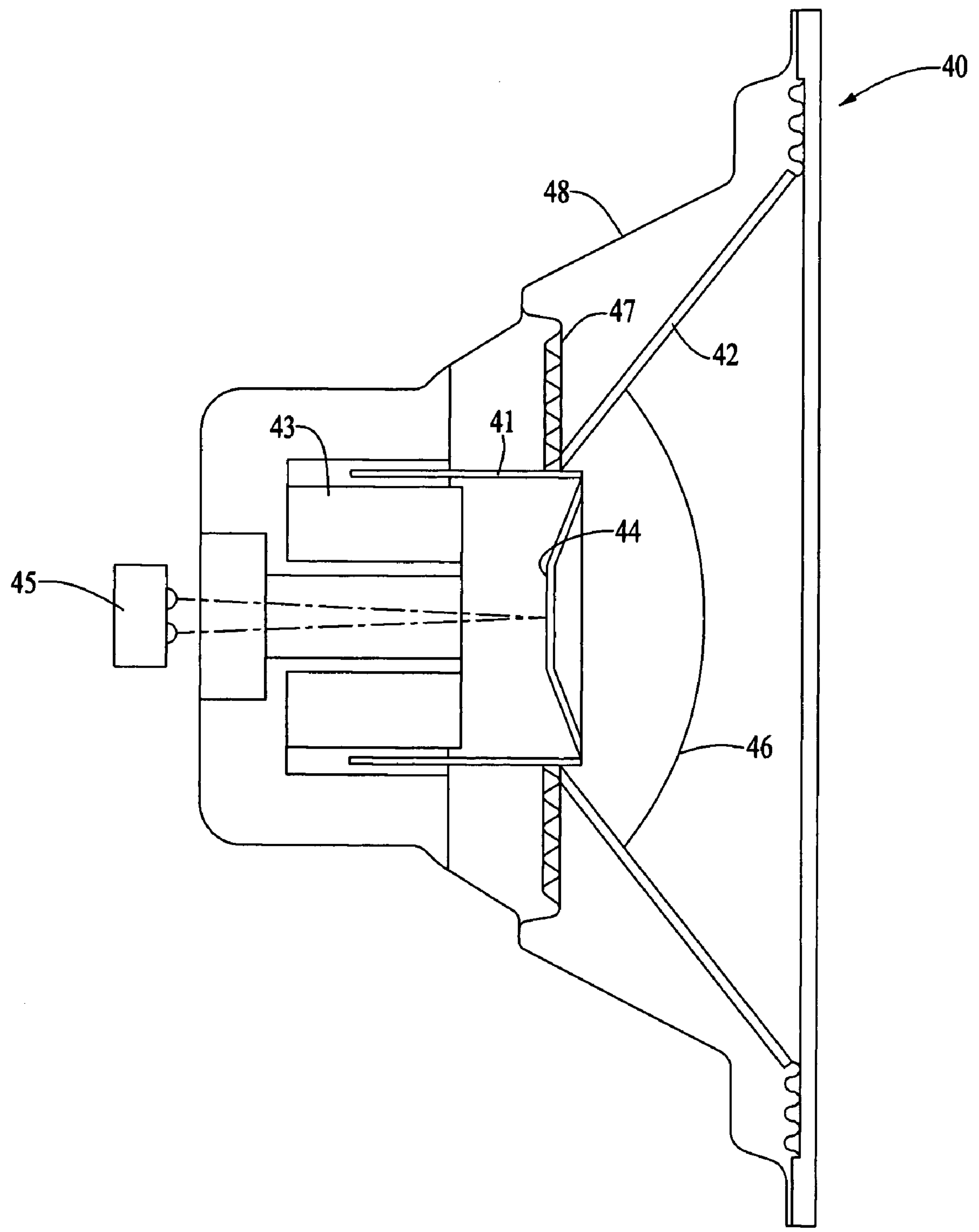
FIG. 3 is a cross-section drawing of a speaker of a speaker system according to an embodiment of the present invention.

FIG. 3 illustrates a schematic diagram depicting the cross section of the speaker section 40. The speaker section 40 may be a cone speaker that comprises a voice coil 41, cone paper 42, a magnet 43, a reflecting plate 44, a sensor 45, a center cap 46, a suspension module 47, and a frame 48. The voice coil 41 may have a cylindrical shape, and may be arranged so that it oscillates along an axis parallel to the length of the cylinder (from left to right in FIG. 3). Oscillating current flow through the voice coil 41 wire creates a magnetic field around the voice coil 41 wire that alternates in direction. This alternating magnetic field induced by the voice coil 41 reacts with the magnetic field formed by the permanent magnet 43, causing the entire voice coil 41 to oscillate at the same frequencies present in the signal flowing through the voice coil 41.

The cone paper 42 is fastened to the voice coil 41, causing it to oscillate with the voice coil 41. As the cone paper 42 oscillates, it disrupts molecules in the medium surrounding it (typically air, but may also be liquid in alternate embodiments), creating sound waves and musical tones in the surrounding medium. The frame 48 forms the outer periphery of the speaker section 40 and acts as a support structure for the speaker section 40. The suspension module 47 connects the cone paper 42 and voice coil 41 to the frame 48 and helps keep the cone paper 42 and the voice coil 41 centered with respect to the frame 48 along an axis perpendicular to the oscillation by the voice coil 41. The center cap 46 is positioned over the center of the cone paper 42 to cover the voice coil 41.

The reflecting plate 44 may be affixed to the side of the voice coil 41 closest to the center cap 46 (as shown in FIG. 3). The reflective side of the reflecting plate 44 should face in the direction away from the center cap 46 and towards the light sensor 45, located near the back of the speaker section 40. Because the reflecting plate 44 is affixed to the voice coil 41, it oscillates in tune with the voice coil 41, cone paper 42, and center cap 46. Generally the reflecting plate 44 may be affixed to any component of the speaker section 40 that oscillates in rhythm with the voice coil 41. In prior systems and methods, the reflecting plate 44 has been fastened to the center cap 46. However, doing so may change the sound pressure characteristics of the center cap, causing undesirable distortion.

In an embodiment of the present invention, the center portion of the cylindrical shaped magnet 43 has a cylindrical shaped void that is concentric with the magnet 43. In other embodiments, the magnet 43 may have other polygonal shapes in combination with a center void that may be cylindrical or any other polygonal shape. The light sensor 45 is furnished with a light source that radiates light through the void in the center of the magnet 43. The light reflects off the reflecting plate 44 and is sensed by the photoreceptor element located on the light sensor 45. The light source radiates light toward the reflecting plate 44 at all times while the power of the speaker system 1 is turned on. The photoreceptor element comprises a phototransistor or the like, which generates an electric signal according to an amount of light reflected by the reflecting plate 44 onto the phototransistor. The shorter the distance between the sensor 45 and the reflecting plate 44, the higher the voltage generated by the photoreceptor element. The light sensor 45 is fastened to the frame 48 (not shown in FIG. 3).

Figure 4:
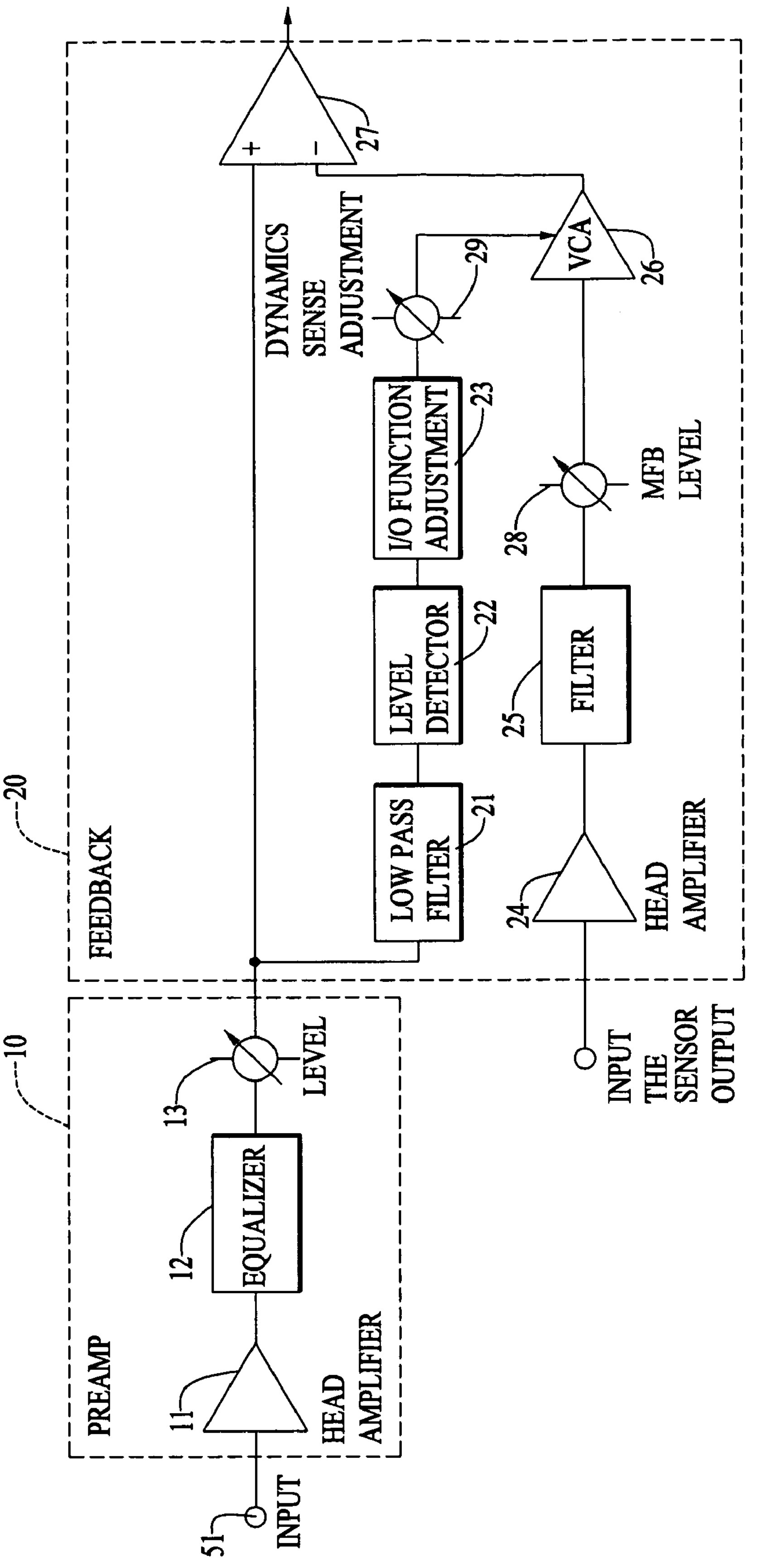
FIG. 4 is a block diagram that shows an electrical configuration of a preamp section and a feedback section of a speaker system according to an embodiment of the present invention.

FIG. 4 shows a more detailed block diagram of some of the components that comprise the preamp unit 10 and feedback unit 20 of the speaker system 1. The components are described with reference to functional blocks and not necessarily discrete hardware elements. The functions may be implemented using one or more of hardware, software, and firmware. In addition, more than one function, or different parts of functions, may be combined in a given hardware, software, or firmware implementation.

Referring to FIG. 4, the preamp unit 10 comprises a head amplifier (head amp) 11, an equalizer 12, and a volume control 13. The head amp 11 amplifies the electric signal that has been applied to the input terminal 51. The equalizer 12 adjusts the frequency characteristics of the now amplified electric signal in accordance with the settings of the bass adjustment knob 52, mid-range adjustment knob 53, and treble adjustment knob 54 (see FIG. 2). The volume control 13 may be a variable resistor that that controls the amplitude of the electric signal in accordance with the settings of the volume adjustment knob 57.

The feedback unit 20 comprises a low-pass filter 21, a level detector 22, an input/output function adjustment section (I/O adjustment section) 23, a dynamics sense adjustment control 29, a head amplifier (head amp) 24, a filter 25, a motional feedback level adjusting control unit (MFB control) 28, a voltage controlled amplifier (VCA) 26, and a differential amplifier 27.

The output of the preamp unit 10 is applied to the positive terminal of the differential amplifier 27, and to the input of the low-pass filter 21. The low-pass filter 21 allows low frequency components of the input signal to pass through and be applied to the input of the level detector 22. The frequency characteristics, such as cut-off frequency, of the low-pass filter 21 are set by the low register. As an example, the low-pass filter may have a cut-off frequency of 100 Hz. The level detector 22 carries out full wave rectification of the signal applied to its input, and acquires the absolute value of the signal. The resulting signal represents an envelope of the amplitude of the electric signal that was applied at the input of the low-pass filter 21. The I/O adjustment section 23 takes in input signal values and scales them to generate output signal values in accordance with one or more of the various curves shown in FIG. 5.

Figure 5:
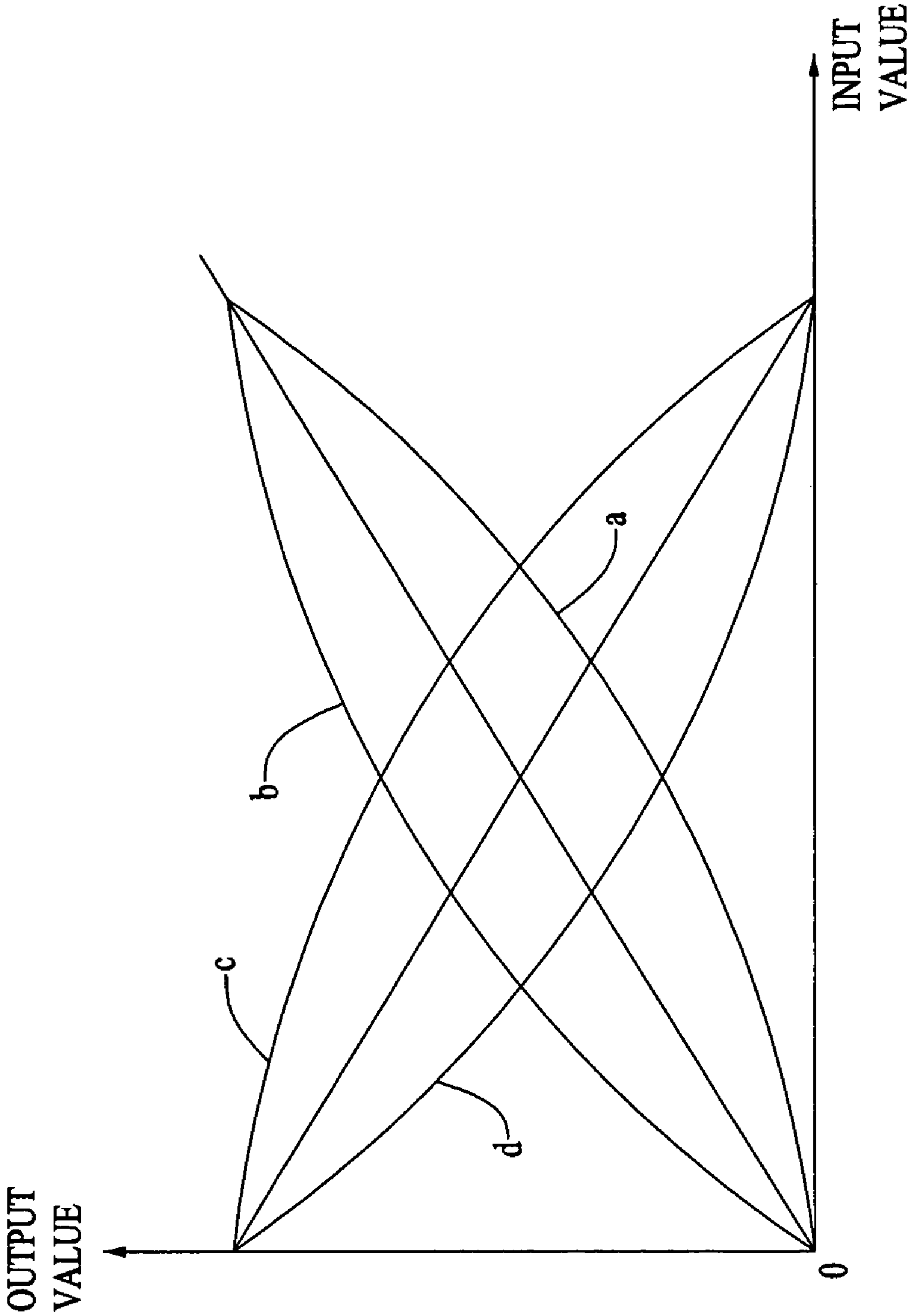
FIG. 5 is a graph that shows I/O functions.

FIG. 5 shows a plurality of conversion curves that the I/O adjustment section 23 may use when scaling input signal values. Generally, conversion curves “a” and “b” have a positive slope so that output signal values increase as input signal values increase. Specifically, conversion curve “a” has a curved shape such that the rate of increase in the output signal values are small when input signal values are small, and the rate of increase in the output signal values are large when the input signal values are large. Conversion curve “b” has curved shape such that the rate of increase in the output signal values are large when input signal values are small, and the rate of increase in the output signal values are small when input signal values are large.

Conversion curves “c” and “d” generally have a negative slope so that output signal values decrease as input signal values increase. Specifically, conversion curve “c” has a curved shape such that the rate of decrease in the output signal values are small when input signal values are small, and the rate of decrease in the output signal values are large when the input signal values are large. Conversion curve “d” has curved shape such that the rate of decrease in the output signal values are large when input signal values are small, and the rate of decrease in the output signal values are small when input signal values are large.

The output of the I/O adjustment section 23 is then applied to the dynamics sense adjustment control 29 which may be a variable resistor that controls the amplitude of the electric signal at that point in accordance with the settings of the dynamics sense knob 56. The output of the dynamics sense adjustment control 29 is then applied to the control terminal of the VCA 26.

The photoreceptive element of the light sensor 45 generates an electric signal that represents the displacement as a function of time of the voice coil 41 and attached cone paper 42 and center cap 46. This signal is amplified by the head amp 24 and then filtered by a secondary differentiation filter 25. The filter 25 output signal represents the acceleration as a function of time of the voice coil 41, and attached cone paper 42 and center cap 46. This quantity is useful because the sound pressure characteristics of the cone paper 42 and center cap 46 (and thus tones produced by the cone speaker) are proportional to the acceleration of the voice coil 41, and attached cone paper 42 and center cap 46.

The output of the filter 25 is then applied to the MFB control 28, which may be a variable resistor that controls the amplitude of the electric signal at that point, in accordance with the settings of the MFB knob 55. Thus the MFB control 28 controls the level of the feedback signal that is applied to the differential amplifier 27. The output of the MFB control 28 is then applied to the input terminal of the VCA 26. The VCA 26 is an amplifier whose amplification gain can be varied based on the voltage level supplied to its control terminal. The output of the VCA 26 is applied to the negative terminal of the differential amplifier 27. The differential amplifier 27 amplifies the signal difference between its positive and negative terminals, and outputs the result to the power amplifier unit 30. The power amplifier unit 30 amplifies the signal and applies it to the speaker section 40.

Figure 6A:
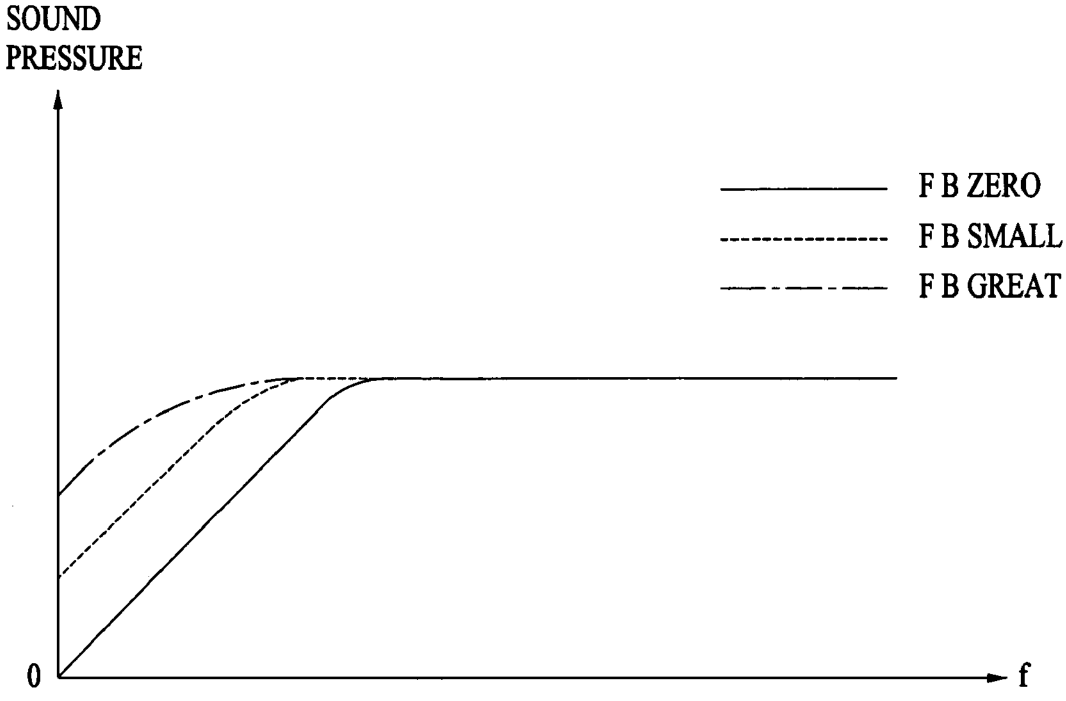
FIG. 6 are drawings that show characteristics of a musical tone that changes in accordance with feedback amount, where 6(*a*) is a graph that shows frequency characteristics and 6(*b*) is a graph that shows an output waveform in a case where a sine wave has been input.
Figure 6B:
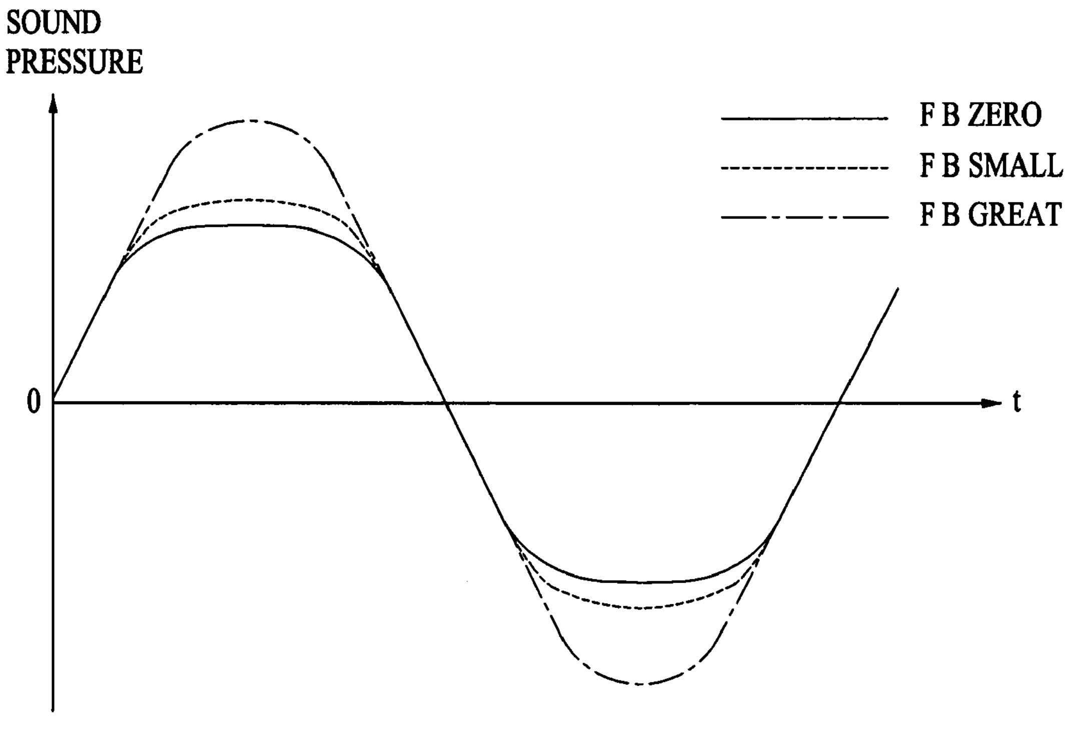

FIG. 6(*a*) illustrates the frequency response of the speaker system 1 with varied levels of motional feedback signal applied by the MFB level adjusting control 28. The graph depicts sound pressure (vertical axis) produced by the speaker section 40 as a function of frequency (horizontal axis). The solid line represents the frequency response of the speaker system 1 when the motional feedback amount is zero; the dashed line represents the frequency response of the speaker system 1 when the motional feedback amount is small; and the long and short dashed line represents the frequency response of the speaker system 1 when the motional feedback amount is great. As the amount of motional feedback is increased, the sound pressure of the speaker section 40 increases for lower frequencies, giving the speaker system 1 a flatter, wider frequency response.

Although it is not shown in FIG. 6(*a*), when motional feedback is applied, the sound pressure at mid-range and high frequency areas of the frequency response (where the dashed line and long and short dashed line are flat) is slightly lower then when the amount of motional feedback is zero. However, an amplifier may be used at the output signal of the preamplifier unit 10 to gain up the signal in proportion to the amount of motional feedback that is to be applied. This ensures that the gain of the speaker system at mid-range and high frequencies when motional feedback is applied is comparable to the gain at those frequencies when motional feedback is not applied.

FIG. 6(*b*) shows the output of the speaker section 40 in the time domain with varied levels of motional feedback applied by the MFB level control 28. The graph depicts sound pressure (vertical axis) produced by the speaker section 40 as a function of time (horizontal axis) for a 50 Hz sine wave signal applied to the input terminal 51. The solid line represents the sound pressure as a function of time for the speaker system 1 when the motional feedback amount is zero; the dashed line represents the sound pressure as a function of time for the speaker system 1 when the motional feedback amount is small; and the long and short dashed line represents the sound pressure as a function of time for the speaker system 1 when the motional feedback amount is great. When the amount of motional feedback applied is zero, there is considerable distortion and compression of the 50 Hz sine wave. As motional feedback is applied, the amount of distortion is reduced, resulting in a fairly faithful reproduction of the sound wave when the amount of motional feedback is great.

In the embodiments of the speaker system 1 described above, detection of the mechanical oscillation of the speaker section 40 to provide and utilize a feedback signal, reduces low frequency signal distortion to produce musical tones having optimum timbre.

In an embodiment of the present invention, the amount of feedback applied by the MFB control 28 can be reduced when the signal output level of the preamp unit 10 is large (the volume control knob 57 setting is high) to not overdrive the power amplifier 30 and to help reduce distortion.

In the embodiments of the present invention described above, the preamp unit 10 and the feedback unit 20 may be comprised of analog circuit devices. In alternate embodiments of the present invention, the preamp unit 10 and the feedback unit 20 may be comprised of digital circuit components, or a combination of analog and digital circuit components. An analog to digital (A/D) converter may digitize the analog input signals applied to the input terminal 51 at a specific sampling rate, and the functions performed by the preamp unit 10 and feedback unit 20 may also be carried out using digital circuit components, such as but not limited to digital signal processors (DSPs) and field programmable gate arrays (FPGAs).

Thus, functions performed by the head amp 11, equalizer 12, volume control 13, low-pass filter 21, level detector 22, I/O adjustment section 23, and dynamics sense control 29, may all be performed in the digital domain by use of digital components, such as DSPs and/or FPGAs. Also, an A/D may digitize the analog signal provided by the light sensor 45 before applying it to the head amp 24. The functions performed by the head amp 24, filter 25, MFB control 28, and VCA 26, may also be performed using digital circuit components, such as one or more of DSPs and/or FPGAs. A digital to analog converter (D/A) may then be used to convert the digital signal output from the digital circuit components to an analog signal that may be amplified by the power amplifier 30.

In the embodiments of the present invention described above, the feedback unit 20 includes a low-pass filter 21, level detector 22, I/O adjustment section 23, dynamics sense control 29, and VCA 26. These components helped adjust the amount of motional feedback applied based on the signal output level from the preamp unit 10. However, in other embodiments of the present invention, the feedback unit 20 may be only comprised of one head amp 24, a filter 25, a MFB control 28, and a differential amplifier 27. The output of the preamp unit 10 may be input to the positive terminal of the differential amplifier 27. The output of sensor 45 may be applied to the head amp 24; the output of the head amp 24 may be applied to the filter 25; the output of the filter 25 may be applied to the MFB control 28; and the output of the MFB control 28 may be directly connected to the negative terminal of the differential amplifier 27.

In other embodiments of the present invention, the I/O adjustment section 23 may be configured to scale the signal value detected by the sensor 45, and applying that scaled value to the differential amplifier 27.

Although in some embodiments the output signal level detected of the preamp unit 10 adjusts the amount of feedback applied, in other embodiments the level set at the volume control 13 by the volume control knob 57 may control the amount of feedback applied. In yet other embodiments, the amount of feedback applied may be based on the equalizer 12 settings controlled by the bass 52, mid-range 53, and treble control knobs 54.

In yet other embodiments of the present invention, the reflecting plate 44 and the sensor 45 may be replaced by attaching a piezoelectric element to the voice coil 41 that senses the acceleration of the voice coil 41. In such a configuration the filter 25 is not necessary.

The embodiments disclosed herein are to be considered in all respects as illustrative, and not restrictive of the invention. The present invention is in no way limited to the embodiments described above. Various modifications and changes may be made to the embodiments without departing from the spirit and scope of the invention. The scope of the invention is indicated by the attached claims, rather than the embodiments. Various modifications and changes that come within the meaning and range of equivalency of the claims are intended to be within the scope of the invention.

What is claimed is:

1. A speaker system for a musical instrument comprising:

an input terminal to which an electrical signal may be applied;

a preamplifier unit that alters the frequency characteristics of an electrical signal applied to said input terminal;

a power amplifier that amplifies said electrical signal;

a speaker that is driven by said power amplifier;

a feedback means that detects displacement of said speaker, generates a feedback signal that is representative of the displacement of said speaker, and feeds back said feedback signal to said power amplifier;

a feedback amount setting means that sets an amount of said feedback signal that is fed back by said feedback means;

a level detection means that detects an output level of said preamplifier unit;

wherein the amount of feedback set by said feedback amount setting means becomes smaller as the level that has been detected by said level detection means becomes higher; and wherein said power amplifier amplifies the electrical signal in conformance with the output of said preamplifier unit and said feedback signal, the feedback amount of which has been set by said feedback amount setting means.

2. The speaker system for a musical instrument as in claim 1, wherein said speaker comprises:

a cylindrical shaped voice coil that has a reflecting plate in the center;

a light source that radiates light toward the reflecting plate; and a photoreceptor element that receives said light that has been reflected by said reflecting plate.

3. The speaker system for a musical instrument as in claim 1, further comprising:

a low pass filter through which the low frequency component of the output of said preamplifier unit passes; and wherein said level detection means detects the output level of said low pass filter.

4. The speaker system for a musical instrument as in claim 3, wherein the low pass filter has a cut-off frequency of no more than about 100 Hz.

5. The speaker system for a musical instrument as in claim 1, further comprising:

a sense adjusting means that adjusts the output level of said preamplifier unit that has been detected by said level detection means; and said feedback amount setting means sets the amount of the feedback in conformance with the adjusted output level of said preamplifier unit.

6. A speaker system for a musical instrument comprising:

an input terminal to which an electrical signal may be applied;

a preamplifier unit that alters the frequency characteristics of an electrical signal applied to said input terminal;

a power amplifier that amplifies said electrical signal;

a speaker that is driven by said power amplifier;

a feedback means that detects displacement of said speaker, generates a feedback signal that is representative of the displacement of said speaker, and feeds back said feedback signal to said power amplifier;

a feedback amount setting means that sets an amount of said feedback signal that is fed back by said feedback means;

a level detection means that detects an output level of said preamplifier unit;

wherein the amount of feedback set by said feedback amount setting means becomes larger as the level that has been detected by said level detection means becomes higher; and wherein said power amplifier amplifies said electrical signal in conformance with the output of said preamplifier unit and said feedback signal, the feedback amount of which has been set by said feedback amount setting means.

7. The speaker system for a musical instrument as in claim 6, wherein said speaker comprises:

a cylindrical shaped voice coil that has a reflecting plate in the center;

a light source that radiates light toward the reflecting plate; and a photoreceptor element that receives said light that has been reflected by said reflecting plate.

8. The speaker system for a musical instrument as in claim 6, further comprising:

a low pass filter through which the low frequency component of the output of said preamplifier unit passes; and wherein said level detection means detects the output level of said low pass filter.

9. The speaker system for a musical instrument as in claim 8, wherein the low pass filter has a cut-off frequency of no more than about 100 Hz.

10. The speaker system for a musical instrument as in claim 6, further comprising:

a sense adjusting means that adjusts the output level of said preamplifier unit that has been detected by said level detection means; and said feedback amount setting means sets the amount of the feedback in conformance with the adjusted output level of said preamplifier unit.

11. A speaker system for a musical instrument comprising:

an input terminal to which an electrical signal may be applied;

a preamplifier unit that alters the frequency characteristics of an electrical signal applied to said input terminal;

a power amplifier that amplifies said electrical signal;

a speaker that is driven by said power amplifier;

a feedback means that detects displacement of said speaker, generates a feedback signal that is representative of the displacement of said speaker, and feeds back said feedback signal to said power amplifier;

a feedback amount setting means that sets an amount of said feedback signal that is fed back by said feedback means;

a volume control operator that sets the volume of an audio sound that is output by said speaker as desired;

wherein the amount of feedback set by said feedback amount setting means becomes smaller as the output level that has been set by said volume control becomes higher; and wherein said power amplifier amplifies said electrical signal in conformance with the output of said preamplifier unit and said feedback signal, the feedback amount of which has been set by said feedback amount setting means.

12. The speaker system for a musical instrument as in claim 11, wherein said speaker comprises:

a cylindrical shaped voice coil that has a reflecting plate in the center;

a light source that radiates light toward the reflecting plate; and a photoreceptor element that receives said light that has been reflected by said reflecting plate.

13. The speaker system for a musical instrument as in claim 11, further comprising:

a low pass filter through which the low frequency component of the output of said preamplifier unit passes; and a level detection means that detects the output level of said low pass filter.

14. The speaker system for a musical instrument as in claim 13, wherein the low pass filter has a cut-off frequency of no more than about 100 Hz.

15. The speaker system for a musical instrument as in claim 11, further comprising:

a level detection means that detects an output level of said preamplifier;

a sense adjusting means that adjusts the output level of said preamplifier unit that has been detected by said level detection means; and said feedback amount setting means sets the amount of the feedback in conformance with the adjusted output level of said preamplifier unit.

16. A speaker system for a musical instrument comprising:

an input terminal to which an electrical signal may be applied;

a preamplifier unit that alters the frequency characteristics of an electrical signal applied to said input terminal;

a power amplifier that amplifies said electrical signal;

a speaker that is driven by said power amplifier;

a feedback means that detects displacement of said speaker, generates a feedback signal that is representative of the displacement of said speaker, and feeds back said feedback signal to said power amplifier;

a feedback amount setting means that sets an amount of said feedback signal that is fed back by said feedback means;

wherein said preamplifier unit comprises an equalizer operator that sets each band level of a plurality of frequency bands as desired;

wherein the amount of feedback set by said feedback amount setting means becomes smaller as the band levels that have been set by said equalizer operator become higher; and wherein said power amplifier amplifies said electrical signal in conformance with the output of said preamplifier unit and said feedback signal, the feedback amount of which has been set by said feedback amount setting means.

17. The speaker system for a musical instrument as in claim 16, wherein said speaker comprises:

a cylindrical shaped voice coil that has a reflecting plate in the center;

a light source that radiates light toward the reflecting plate; and a photoreceptor element that receives said light that has been reflected by said reflecting plate.

18. The speaker system for a musical instrument as in claim 16, further comprising:

a low pass filter through which the low frequency component of the output of said preamplifier unit passes; and a level detection means that detects the output level of said low pass filter.

19. The speaker system for a musical instrument as in claim 18, wherein the low pass filter has a cut-off frequency of no more than about 100 Hz.

20. The speaker system for a musical instrument as in claim 16, further comprising:

a level detection means that detects an output level of said preamplifier;

a sense adjusting means that adjusts the output level of said preamplifier unit that has been detected by said level detection means; and said feedback amount setting means sets the amount of the feedback in conformance with the adjusted output level of said preamplifier unit.

21. A speaker system comprising:

an input terminal to which an input electrical signal may be applied;

a preamplifier unit that alters the frequency characteristics of an electrical signal applied to said input terminal and provides an output electrical signal having altered frequency characteristics relative to the input electrical signal;

a power amplifier unit that amplifies said electrical signal;

a speaker that is driven by said power amplifier unit;

a feedback unit that detects displacement of said speaker, generates a feedback signal that is representative of the displacement of said speaker, and feeds back said feedback signal to said power amplifier unit;

wherein said power amplifier unit amplifies the electrical signal in conformance with the output of said preamplifier unit and said feedback signal;

a level detector which detects an output level of said preamplifier unit; and a motional feedback level adjusting control unit that controls the amplitude of said feedback signal at least partially dependent on said output level of said preamplifier unit;

wherein said power amplifier unit amplifies said electrical signal in conformance with said feedback signal, the amplitude of which being controlled by said motional feedback level adjusting control unit.

22. A method of making a speaker system operable with an input electrical signal, the method comprising:

coupling a preamplifier unit to alter the frequency characteristics of the electrical signal and provide an output electrical signal having altered frequency characteristics relative to the input electrical signal;

coupling a power amplifier unit to amplify said electrical signal;

coupling a speaker for driving by the power amplifier unit;

connecting a feedback unit to detect displacement of the speaker, generate a feedback signal that is representative of the displacement of the speaker; and feed back the feedback signal to the power amplifier unit;

controlling the power amplifier unit to amplify the electrical signal in conformance with the output of the preamplifier unit and said feedback signal;

detecting an output level of said preamplifier unit; and controlling the amplitude of said feedback signal at least partially dependent on the detected output level of the preamplifier unit, wherein the power amplifier unit amplifies said electrical signal in conformance with said feedback signal, the amplitude of which being controlled at least partially dependent on the detected output level of the preamplifier unit.

* * * * *